United States Patent
Lee et al.

(10) Patent No.: US 6,844,627 B2
(45) Date of Patent: Jan. 18, 2005

(54) METAL FILM SEMICONDUCTOR DEVICE AND A METHOD FOR FORMING THE SAME

(75) Inventors: Jong-Myeong Lee, Seongnam-si (KR); In-Sun Park, Yongin-si (KR); Jong-Sik Chun, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/367,916

(22) Filed: Feb. 19, 2003

(65) Prior Publication Data

US 2004/0051175 A1 Mar. 18, 2004

(30) Foreign Application Priority Data

Sep. 14, 2002 (KR) .................................. 10-2002-0055970

(51) Int. Cl.⁷ ............................................... H01L 23/48
(52) U.S. Cl. ...................... 257/751; 257/774; 257/775; 438/627; 438/638; 438/639; 438/640
(58) Field of Search ............................... 257/774, 775, 257/751; 438/627, 638, 639; 538/640

(56) References Cited

U.S. PATENT DOCUMENTS 5,552,341 A * 9/1996 Lee ........................... 438/643
6,518,648 B1 * 2/2003 Lopatin ....................... 257/663
6,570,252 B1 * 5/2003 Sandhu et al. ............... 257/751
6,617,689 B1 * 9/2003 Honeycutt ................... 257/750
6,624,516 B2 * 9/2003 Fujisawa et al. ............ 257/762
6,639,319 B2 * 10/2003 Trivedi et al. ............... 257/751
6,649,465 B2 * 11/2003 Iijima et al. ................. 438/240
6,674,170 B1 * 1/2004 Ngo et al. .................... 257/774
6,693,356 B2 * 2/2004 Jiang et al. .................. 257/767

FOREIGN PATENT DOCUMENTS

| JP | 57-181172 | * 11/1982 | ........ 257/E29.338 |
| JP | 2001168101 | 6/2001 | |
| KR | 1999017335 | 3/1999 | |
| KR | 1999-017335 | 3/1999 | |
| KR | 20010073825 | 8/2001 | |

OTHER PUBLICATIONS

Korean Office Action Dated Apr. 28, 2004.

* cited by examiner

Primary Examiner—Jasmine Clark
(74) Attorney, Agent, or Firm—Harness Dickey

(57) ABSTRACT

A method for forming a metal film including forming a metal barrier layer on a surface of a substrate, on a bottom surface of a recess and on sidewalls of the recess, forming a first metal film on the substrate but not in the recess, treating the first metal film with nitrogen plasma to form an insulation film including nitrogen, forming a second metal film on a portion of the metal barrier layer in the recess, and forming a third metal film on the substrate, the recess and the insulation film.

25 Claims, 6 Drawing Sheets

METAL FILM SEMICONDUCTOR DEVICE AND A METHOD FOR FORMING THE SAME

This U.S. nonprovisional application claims the priority of Korean Patent Application No. 2002-55970, filed Sep. 14, 2002, in the Korean Intellectual Property Office, the entire contents of which are hereby incorporated herein by reference.

BACKGROUND OF THE INVENTION

1. Field of the Invention

The present invention generally relates to a method for forming a metal film of a semiconductor device, and more particularly, to a method for forming a metal film on a substrate, which includes a recess such as a contact hole or a via hole.

2. Description of the Related Art

The rapid development of information process apparatuses has necessitated the development of semiconductor devices having high operational speed and large storage capacity. Such semiconductor devices have a high integration density, improved reliability, and rapid response speed. These are only several examples of the advantageous attributes attributed to such advanced semiconductor devices.

Regarding the design of a semiconductor device, a metal wiring thereof should have a low electrical resistance and high reliability. Using relatively inexpensive metal wiring helps reduce manufacturing costs. Therefore, aluminum is normally used to form the metal wiring. Recent semiconductor devices require may follow a design rule of below approximately 0.15 $\mu$m, and the contact or via hole may be required to have a high aspect ratio. Therefore, a method for sufficiently filling the contact or via hole with an aluminum wiring has been developed.

For example, one such method includes forming an aluminum film directly on a substrate that has a recess such as a contact or via hole, in order to fill the recess by utilizing the re-flow characteristics of the aluminum. This method effectively fills the recess with the aluminum. However, because the aluminum film is rapidly deposited at the entrance of the recess, which has a high aspect ratio, the recess entrance may be blocked. Moreover, the aluminum forming method may create undesirable voids in the recess.

Another method for filling a recess with aluminum requires selectively depositing aluminum on an insulation film and on a conductive film, such as a metal barrier layer. The method can be employed for filling a via hole. However, the method need not be used for filling a contact hole that includes a conductive film, such as a metal barrier layer.

Therefore, a method for completely filling a metal film in a contact hole, while concurrently reducing a contact resistance and an electrical resistance of a wiring has been developed. The method includes selectively forming an anti-nucleation layer (ANL) on a substrate to achieve the aforementioned reductions. An example of such a method is disclosed in U.S. Pat. No. 6,001,420 (issued to Mosely el al.), Korean Patent No. 269,878, Korean Laid Open Patent Publication No. 2001-73825, and Japanese Laid Open Patent Publication No. 2001-168101.

According to the disclosure in Korean Patent No. 269,878, after forming an anti-nucleation layer on a substrate, while avoiding a recess thereof, an aluminum film is continuously formed on a bottom surface and sidewalls of the recess. Then, an aluminum film is formed on the substrate and recess using a sputtering process. This ensures that the recess is filled with the aluminum film. Next, a highly oxidative metal film is formed and, thereafter, the ANL is formed by oxidizing a metal film. This additional oxidation process required for forming the ANL reduces the productivity of the recess filling process.

U.S. Pat. No. 6,001,420 discloses a method for filling a recess with an aluminum film, which includes forming an ANL and an aluminum film in-situ. It is asserted that the method improves the productivity of the recess filling process. According to the '420 patent, the ANL is formed using dimethlyaluminum hydride (DMAH) and a nitrogen gas without a plasma, and the aluminum film for filling the recess is formed by a chemical vapor deposition process. However, forming the ANL is less effective without the use of plasma. Furthermore, the use chemical vapor deposition generally does not fill the recess with aluminum film. The chemical vapor deposition process forms an aluminum film that has a liner shape, which is continuously formed on the bottom surface and on the sidewalls of the recess. As a result, processing failures may occur even though the productivity may be improved.

SUMMARY OF THE INVENTION

An exemplary embodiment of the present invention provides a method for forming a metal film, which may form an insulation film as an anti-nucleation layer (ANL) in-situ by plasma treatment.

An exemplary embodiment of the present invention provides a method for forming a metal film, which may form the metal film and an insulation film as an anti-nucleation layer (ANL) in-situ.

An exemplary embodiment of the present invention provides a method for forming a metal film including forming a metal barrier layer on a surface of a substrate, on a bottom surface of a recess and on sidewalls of the recess, forming a first metal film on the substrate but not in the recess, treating the first metal film with nitrogen plasma to form an insulation film including nitrogen, forming a second metal film on a portion of the metal barrier layer in the recess, and forming a third metal film on the substrate, the recess and the insulation film.

Furthermore, an exemplary embodiment of the present invention provides a method for forming a metal film, including forming a metal barrier layer on a surface of a substrate on a bottom surface of a recess and on sidewalls of the recess, forming an insulation film on the surface of the substrate but not in the recess, forming a first metal film on a portion of the metal barrier layer positioned in the recess, and filling the recess with a second metal film.

Still further, an exemplary embodiment of the present invention provides a semiconductor device, including a metal barrier layer formed in a recess of a substrate, an insulation film formed on a portion of the substrate but not in the recess, a metal film formed on a portion of the metal barrier layer in the recess, and another metal film formed on the substrate.

An exemplary embodiment of the present invention provides a method of forming a semiconductor device, including forming a metal barrier layer in a recess of a substrate, forming an insulation film on a portion of the substrate but not in the recess, forming a metal film on a portion of the metal barrier layer in the recess, and forming another metal film on the substrate.

Further scope of applicability of the present invention will become apparent from the detailed description given hereinafter. However, it should be understood that the detailed description and specific examples, while indicating exemplary embodiments of the invention, are given by way of illustration only, since various changes and modifications within the spirit and scope of the invention will become apparent to those skilled in the art from this detailed description.

BRIEF DESCRIPTION OF THE DRAWINGS

Exemplary embodiments of the present invention will become more fully understood from the detailed description given hereinbelow and the accompanying drawings which are given by way of illustration only, and thus are not limitative of the present invention, and wherein.

DETAILED DESCRIPTION OF THE EXEMPLARY EMBODIMENTS

Figure 1A:
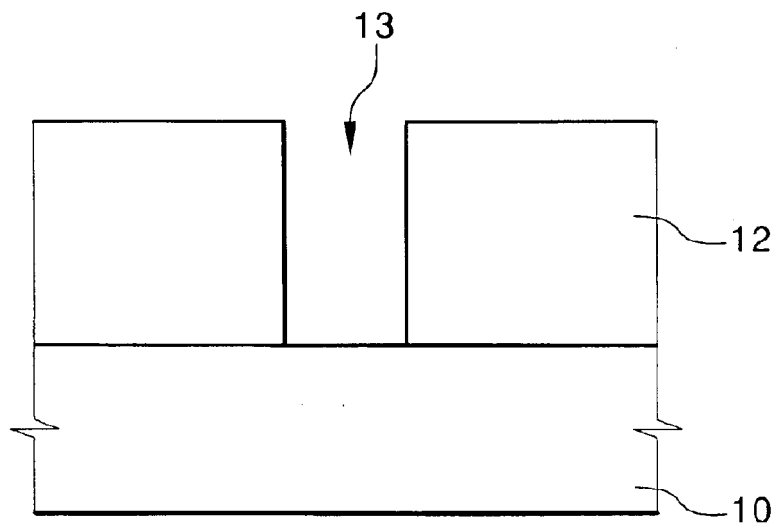
FIGS. 1A through 1F are cross-sectional views illustrating a method for manufacturing a metal film according to an exemplary embodiment of the present invention.

Exemplary embodiments of the present invention are described more fully with reference to the accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. In the drawings, the thickness of layers and regions are exaggerated for clarity. When a layer is referred to as being "on" another layer or substrate, the layer may be directly on the other layer or substrate, or intervening layers may also be present.

In an exemplary embodiment, a substrate has a recess including a contact or via hole. After an interlayer dielectric film is formed on the substrate, the interlayer dielectric film is patterned so that the contact or via hole is formed on the substrate through the interlayer dielectric film. Thus, the substrate has an interlayer dielectric pattern where the contact or via hole is formed. If the recess is a via hole, a metal film may be sufficiently filled in the via hole in accordance with a conventional method. Thus, the recess of an exemplary embodiment may include the contact hole.

If a first metal film is formed to make direct contact with the substrate, a migration of material occurs between the substrate and the first metal film. Hence, a metal barrier layer may be formed on the substrate in order to reduce the migration of material between the substrate and the first metal film. The metal barrier layer is formed on the surface of the substrate, on the bottom surface of the recess, and on the sidewalls of the recess. The metal barrier layer can include a titanium film, a titanium nitride film, or a composite film including titanium and titanium nitride films that are successively formed.

The first metal film is formed on the surface of the substrate. The first metal film may be selectively formed on the portion of the substrate through a chemical vapor deposition process; however, the recess does not receive the first metal film. The first metal film has a low electrical resistance and a relatively high reliability.

The first metal film may be formed in an economical manner. In particular, the first metal film is easily transformed when treated with a nitrogen plasma. Thus, the first metal may be formed using aluminum to meet the above-mentioned conditions. If the first metal film includes an aluminum film, a source gas for forming the first metal film can include a compound such as dimethylethylaminealane (DEMMA), methylpyroridinealane (MPA), dimethylaluminumhydride (DMAH), etc. Although the indicated compounds may be employed alone, the source gas may also include more than two compounds.

The processing conditions for forming the first metal film may be varied in accordance with the chosen compounds. For example, when the source gas includes MPA to form the first metal film, the processing conditions may be varied in the following manner.

The flow rate of MPA is approximately 1 to 10 sccm when used to form the first metal film. The first metal film, in one exemplary embodiment, may be formed at a temperature of approximately 120 to 160° C. Moreover, the first metal film, in one exemplary embodiment, may be formed for approximately 1 to 10 seconds, which creates the desired thickness. Furthermore, if processing conditions are controlled, the first metal film may be formed having a relatively poor step coverage and with a thickness below approximately 100 Å.

The first metal film may be treated with nitrogen plasma in order to change the first metal film into an insulation film having nitrogen. If the first metal film is treated using an $N_2$ or an $NH_3$ plasma, the first metal film is transformed into an aluminum nitride film. At that time, the aluminum nitride film serves as an anti-nucleation layer (ANL), which reduces the likelihood of the formation of a metal film. In one exemplary embodiment of the present invention, the first metal film may be treated with the nitrogen plasma at a temperature of approximately 120 to 160° C., at the pressure of approximately 1 to 10 torr. Also, the nitrogen plasma may be generated using a plasma power of approximately 50 to 500 watts. The nitrogen plasma treatment may be performed for approximately 1 to 60 seconds.

In one exemplary embodiment of the present invention, a first metal film may be changed into an insulation film, which serves as an ANL for reducing the application of the metal film by way of the nitrogen plasma treatment. Therefore, a processing failures may be reduced even in the unlikely event the first metal film plasma treatment is unsuccessful.

Using the nitrogen plasma treatment, the insulation film for reducing the application of the metal film may be formed on the substrate, while the metal barrier layer may be formed on a bottom surface and sidewalls of the recess.

A second metal film may be formed in the recess where the metal barrier layer is positioned. The second metal film may be formed through a chemical vapor application process, or a similar vapor application process. Because the insulation film may be formed on the substrate as an ANL, the second metal film may be formed as a liner in the recess. The second metal film is inexpensive, and has a low electrical resistance and a high reliability similar to that of the first metal film.

The second metal film may include aluminum. If the second metal film includes an aluminum film, the source gas for forming the second metal film may include a compound such as DEMMA, MPA, DMAH, etc. The source gas may include one of the indicated compounds, but may also include a mixture of two or more compounds. The conditions for forming the second metal film may be varied in accordance with the type and number of compounds selected. If the source gas includes MPA to form the second metal film, the processing conditions may be varied as follows.

The flow rate of MPA is approximately 10 to 100 sccm when used to form the second metal film. The second metal film may be formed at a temperature of approximately 120 to 160° C. and under a pressure of approximately 0.2 to 0.5 torr. In addition, the second metal film may be formed for a duration of approximately 20 to 180 seconds, so that a desired thickness achieved. Furthermore, it is desirable if the second metal film is formed having a step coverage superior to that of the first metal film, and formed to have a thickness of approximately 300 to 1,000 Å. Forming the second metal film in such a matter is achievable by controlling processing conditions.

In a method according to an exemplary embodiment of the present invention, if the second metal film including the aluminum film is formed by way of a chemical vapor deposition process, it is possible to substantially ensure that the aluminum film does not completely fill the recess. As a result, the insulation film may be formed on the surface of the substrate while the second metal film is formed as a liner in the recess.

According to an exemplary embodiment of the present invention, the processes including the formation of the first metal film, the nitrogen plasma treatment, and the formation of the second metal film may be accomplished in-situ. That is, because those processes can be executed under a pressure varied in accordance with each process, those processes may be performed in-situ.

A third metal film may be formed on the resultant structure by a sputtering process. The third metal film may include an aluminum film. If the third metal film is formed using aluminum through the sputtering process, the third metal film can be sufficiently filled in the recess. The third metal film may also be formed on the insulation film. In this case, though the insulation film may reduce the nucleation of the metal film, the insulation film does not block the formation of the metal film by the sputtering. Therefore, it is possible to form the third metal film on the insulation film. After the third metal film is formed, it may be re-flowed at a temperature of approximately 400 to 600° C. This re-flowing technique allows the third metal film to be filled in the recess. The metal film formed by a sputtering process generally has uniformity superiority in comparison to a metal film formed by a chemical vapor deposition process. Therefore, the third metal film formed by the sputtering method has better uniformity.

According to an exemplary embodiment of the present invention, resistances of a contact and a wiring, composed of the metal film, may be reduced because the metal films include aluminum. Additionally, the metal films may be selectively deposited so that the recess can be filled with the metal films. In particular, the metal films may be sufficiently employed in the contact hole where the metal barrier layer is formed. Also, the productivity of the processes for forming the metal films may be improved because the processes can be performed in-situ. Furthermore, processing failure may be substantially reduced, since the processing conditions can be appropriately controlled in accordance with the characteristics of the metal films.

The substrate of the exemplary embodiment described hereinbelow is substantially identical to that used in the exemplary embodiment discussed hereinabove. The substrate may include a recess. A metal barrier layer may also be formed using a process similar to that of the first exemplary method. In particular, the metal barrier layer may be formed on the surface or a portion of the substrate, on the bottom surface of the recess, and on the sidewalls of the recess.

An insulation firm that serves as an ANL for reducing the application of a metal film may be formed on the substrate utilizing a nitrogen plasma treatment. The insulation film may include nitrogen because the insulation film may be formed employing a chemical vapor application process and the nitrogen plasma treatment. A source gas for forming the insulation film may include a compound such as dimethyl-ethylaminealane (DEMMA), methylpyroridinealane (MPA), dimethylaluminumhydride (DMAH), etc. Although those compounds may be used alone in the source gas for forming the insulation film, the source gas may include more than two of the indicated compounds. The processing conditions for forming insulation film may be varied in accordance with the compound or compounds chosen. For example, if the source gas includes MPA, the processing conditions may be varied as follows.

When forming the insulation film, the flow rate of the MPA is approximately 1 to 10 sccm. In an exemplary embodiment of the present invention, the insulation film may be formed at a temperature of approximately 120 to 160° C. and under a pressure of approximately 1 to 10 torr. Moreover, the first metal film, in one exemplary embodiment, may be formed for approximately 1 to 10 seconds, which creates the desired thickness. Furthermore, if processing conditions are controlled, the first metal film may be formed having a relatively poor step coverage and with a thickness below approximately 100 Å.

In a method according to an exemplary embodiment of the present invention, because a nitrogen plasma treatment may be executed using $N_2$ or $NH_3$ plasma, the source gas having metal will form the insulation film as opposed to the metal film. The nitrogen plasma may be generated using a plasma power of approximately 50 to 500 watts. Also, the insulation film may be directly formed on the substrate Therefore, processing failures may be reduced, which commonly occur when a plasma treatment is not used for development of the insulation film.

According an exemplary embodiment of the present invention, the chemical vapor deposition process and the nitrogen plasma treatment are used to form the insulation film on the substrate so as to serve as an ANL; and the metal barrier layer may be formed on the bottom surface and the sidewalls of the recess.

A first metal film may be formed in the recess where the metal barrier layer is positioned. The first metal film of an exemplary embodiment of the present invention may be formed employing the process similar to that of the exemplary embodiments discussed hereinabove. Thus, the insulation film may be formed on the surface of the substrate, while the first metal film may be formed having a liner shape in the recess. Moreover, the processes for forming the insulation and the first metal films may be performed in-situ. This is possible since processes may be executed under varied pressure, in accordance with each process.

A second metal film may be formed on the resultant structure by a sputtering process. The second metal film of an exemplary embodiment of the present invention may be formed using a process similar to the previously discussed process for forming a third metal film.

According to an exemplary embodiment of the present invention, resistances of a contact and a wiring, composed of the metal film, may be reduced because the metal films include aluminum. Additionally, the metal films may be selectively deposited so that the recess can be filled with the metal films. In particular, the metal films may be sufficiently employed in the contact hole where the metal barrier layer is formed. Also, the productivity of the processes for forming the metal films may be improved because the processes can be performed in-situ. Furthermore, processing failures may be substantially reduced, since the processing conditions can be appropriately controlled in accordance with the characteristics of the metal films.

Exemplary embodiments according to the present invention, for forming the discussed metal films, will now be described with reference to the accompanying drawings.

FIGS. 1A to 1F are cross-sectional views illustrating a method for forming a metal film according to an exemplary embodiment of the present invention.

Figure 1B:
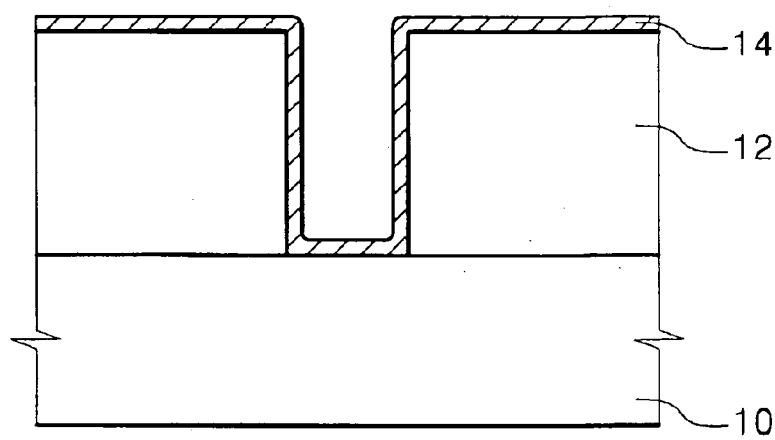

Referring to FIGS. 1A and 1B, an interlayer dielectric film may be formed on a substrate 10. An interlayer dielectric film pattern 12 including a contact hole 13 may be formed on the substrate 10 by way of a photolithography process, or other similar processes.

A metal barrier layer 14 having a titanium film and titanium nitride film may be formed on the interlayer dielectric film pattern 12 and in the contact hole 13. Thus, the metal barrier layer 14 may be formed on a portion or the entire surface of the interlayer dielectric film pattern 12, on the bottom surface of the contact hole 13, and on the sidewalls of the contact hole 13.

Figure 1C:
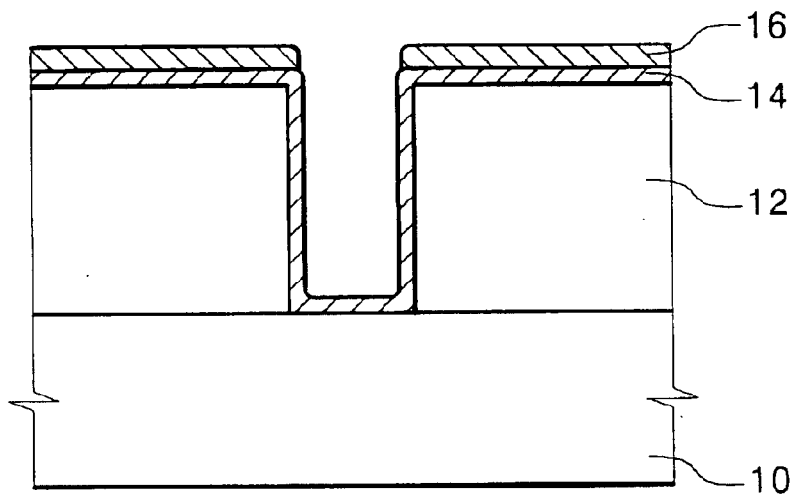

Referring to FIG. 1C, an aluminum film 16 may be formed on a first portion of the metal barrier layer 14 by a chemical vapor application process. A second portion of the metal barrier layer 14 positioned in the contact hole 13 need not undergo the chemical vapor application process. The aluminum film 16 may be formed for about 3 seconds, at a temperature of approximately 140° C., and under a pressure of approximately 5 torr. The source gas for forming the aluminum film 16 may use at least MPA having a flow rate of approximately 5 sccm. Hence, the aluminum film 16 may have poor step coverage and a thickness below approximately 100 Å.

Figure 1D:
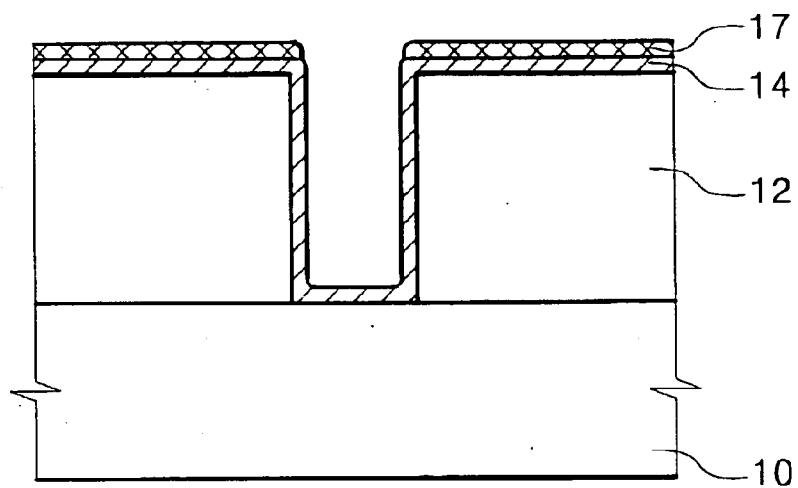

Referring to FIG. 1D, the aluminum film 16 may be treated using nitrogen plasma, while the source gas may be blocked so that the aluminum film 16 on the first portion of metal barrier layer 14 is changed into an aluminum nitride film 17. The aluminum nitride film 17 may reduce the likelihood that a metal film, as an ANL, is deposited thereon. The nitrogen plasma treatment may be performed using a plasma power of approximately 100 watts and at a temperature of approximately 140° C. The nitrogen plasma treatment may be executed for about 10 seconds under a pressure of approximately 5 torr.

Figure 1E:
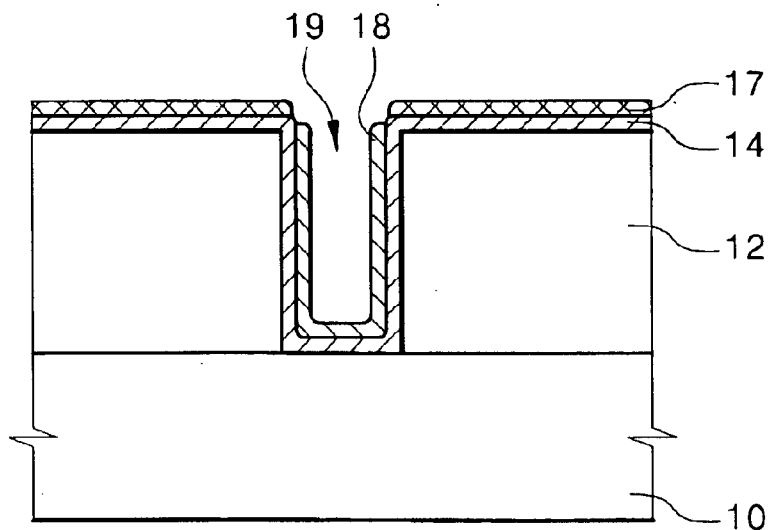

Referring to FIG. 1E, an aluminum film 18 may be formed on the second portion of the metal barrier layer 14 positioned in the contact hole 13. The aluminum film may be formed using a chemical vapor deposition process or other similar process. The aluminum film 18 may be formed at a temperature of approximately 140° C., for about 60 seconds, and under a pressure of approximately 1 torr. The source gas for forming the aluminum film 18 may use at least MPA having a flow rate of approximately 30 sccm. Accordingly, the aluminum film 18 may have relatively good step coverage and the thickness of approximately 500 Å. The aluminum film 18 may be formed as a liner or having a liner shape on a bottom surface and on the sidewalls of the contact hole 13.

Figure 1F:
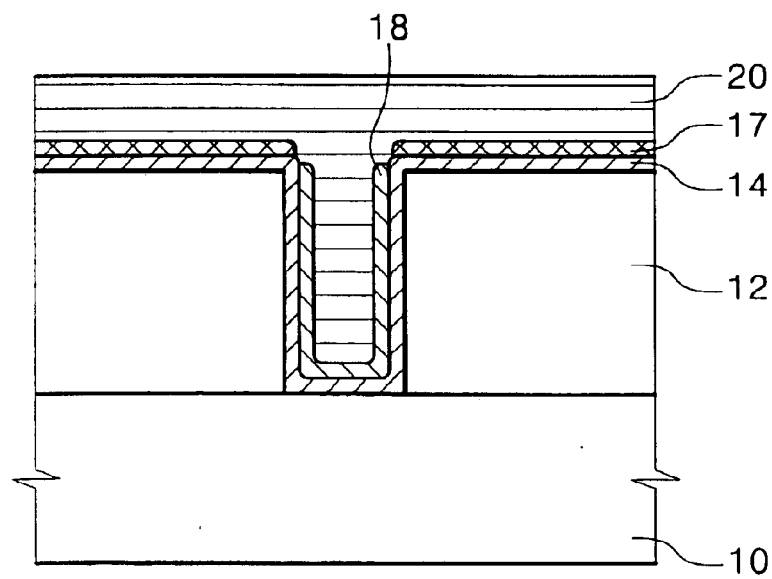

Referring to FIG. 1F, using a sputtering process, an aluminum film 20 may formed over the resultant structure formed on the substrate 10. The aluminum film 20 is re-flowed at a temperature of approximately 500° C. As a result, the aluminum film 20 sufficiently fills the contact hole 13, while the aluminum film 20 is substantially uniformly formed on the resultant structure.

EXAMPLE 2

FIGS. 2A to 2E are cross-sectional views illustrating a method for forming a metal film according to another exemplary embodiment of the present invention.

Figure 2A:
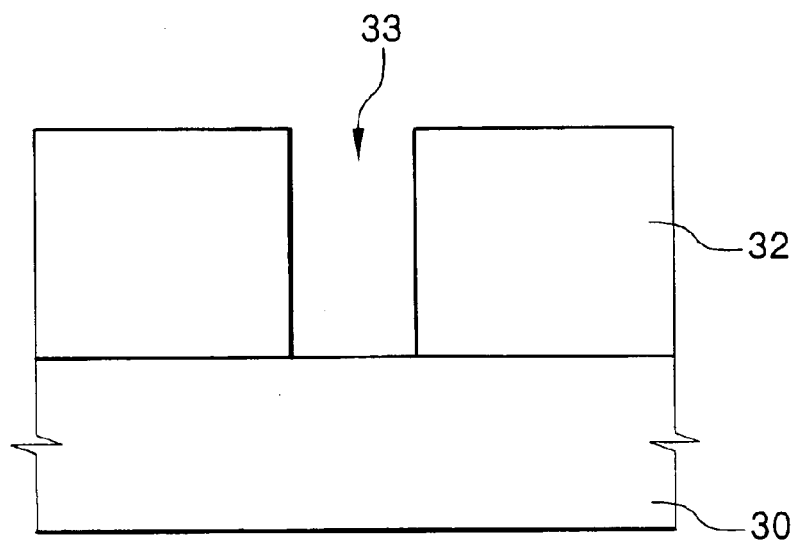
FIGS. 2A through 2E are cross-sectional views illustrating a method for manufacturing a metal film according to another exemplary embodiment of the present invention.
Figure 2B:
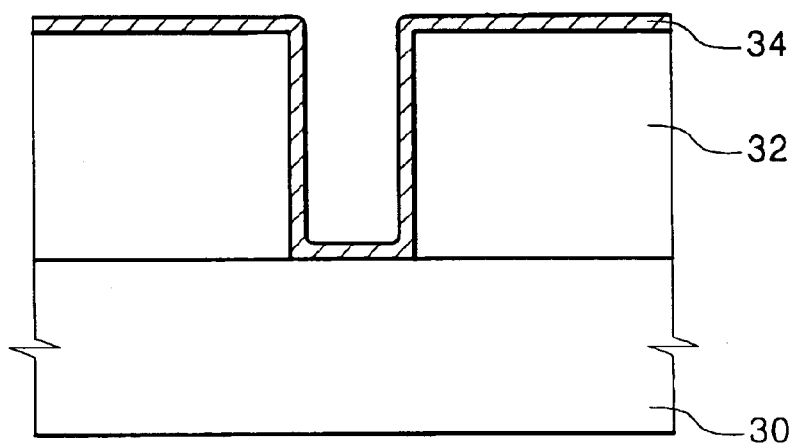

Referring to FIGS. 2A and 2B, an interlayer dielectric film may be formed on a substrate 30. An interlayer dielectric film pattern 32 having a contact hole 33 may then be formed on the substrate 30 by way of a photolithography process or other similar process.

Subsequently, a metal barrier layer 34 having a titanium film and titanium nitride film may be formed on the interlayer dielectric film pattern 32 and in the contact hole 33. The metal barrier layer 34 may be formed on the surface or a portion of the interlayer dielectric film pattern 32, on the bottom surface of the contact hole 33, and on the sidewalls of the contact hole 33.

Figure 2C:
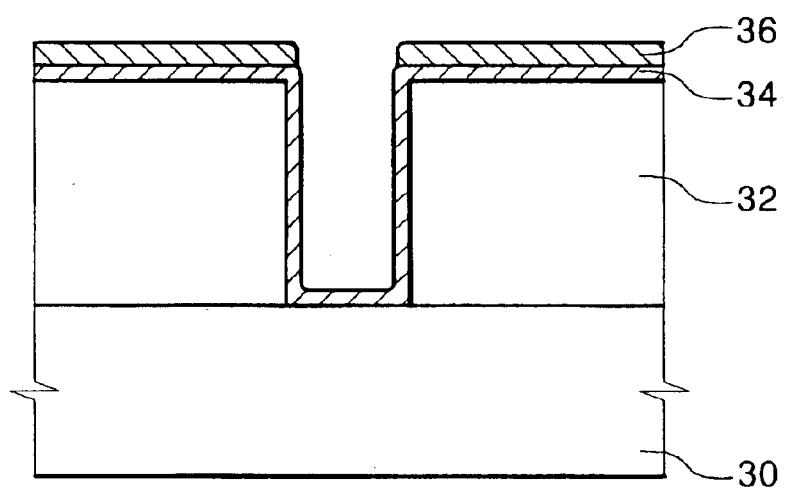

Referring to FIG. 2C, an aluminum nitride film 36 may be formed on a first portion of the metal barrier layer 34 using a chemical vapor application and a nitrogen plasma treatment processes. However, a second portion of the metal barrier layer 34 positioned in the contact hole 33 need not receive the aluminum nitride film 36. The aluminum nitride film 36 may be formed for about 3 seconds, at the temperature of approximately 140° C., and under a pressure of approximately 5 torr. The nitrogen plasma treatment may be performed using a plasma power of approximately 100 watts. The source gas for forming the aluminum nitride film 36 may include MPA that has a flow rate of approximately 5 sccm. Therefore, the aluminum nitride film 36 may have poor step coverage and a thickness below approximately 100 Å.

Figure 2D:
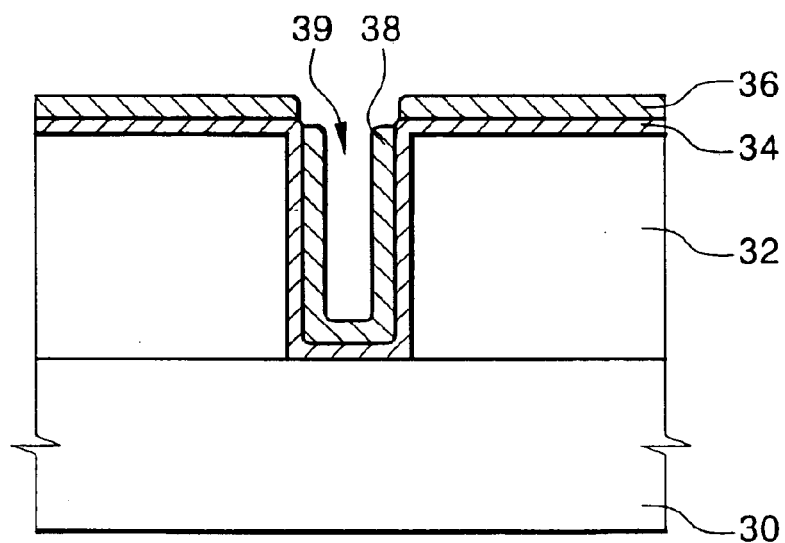

Referring to FIG. 2D, the aluminum film 38 may be formed on the second portion of the metal barrier layer 34 positioned in the contact hole 33 using a chemical vapor application process. The aluminum film 38 may be formed at a temperature of approximately 140° C., for about 60 seconds, and under a pressure of approximately 1 torr. The source gas for forming the aluminum film 38 may include at least MPA having a flow rate of approximately 30 sccm. Therefore, the aluminum film 38 may have relatively good step coverage and a thickness of approximately 500 Å. The aluminum film 38 may be formed as a liner or having a liner shape formed on the bottom surface and on the sidewalls of the contact hole 33.

Figure 2E:
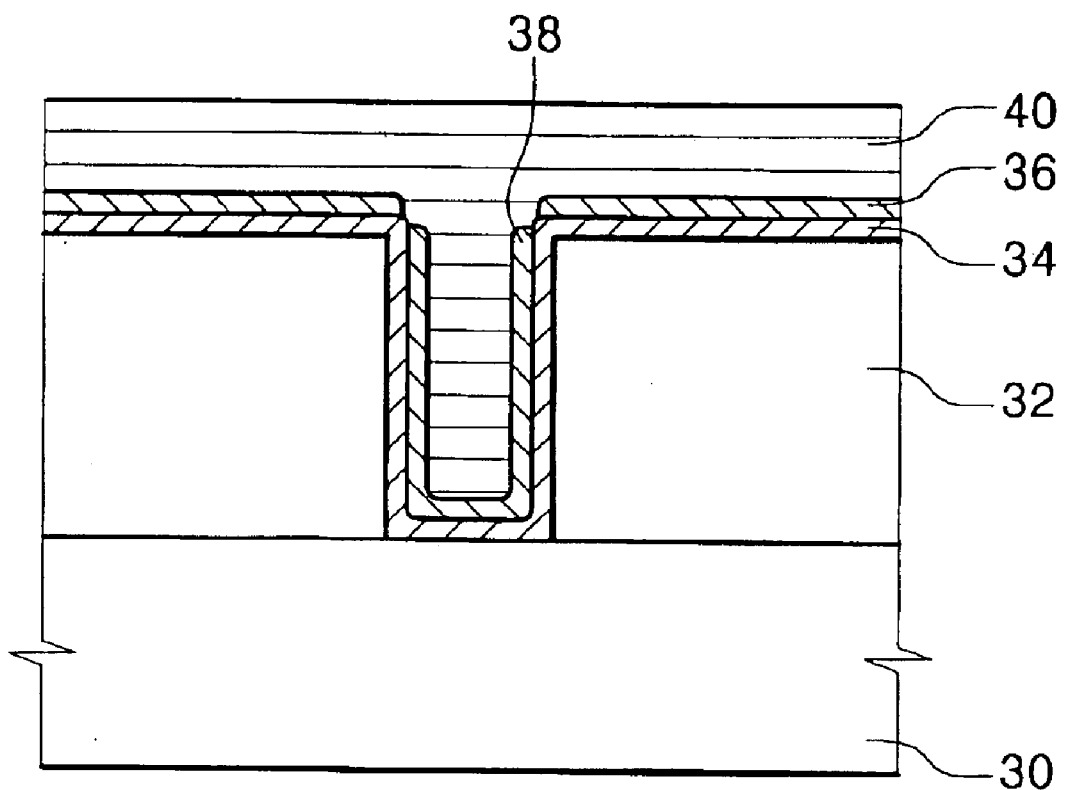

Referring to FIG. 2E, using a sputtering process, an aluminum film 40 may be formed on the resultant structure formed on the substrate 30. The aluminum film 38 may be reflowed at a temperature of approximately 500° C. Therefore, the aluminum film 40 may sufficiently fill the contact hole 33, and the aluminum film 40 may be substantially uniformly formed on the resultant structure.

According to exemplary embodiments of the present invention, a metal film may be filled in the recess having high aspect ratio. In particular, the metal film may be advantageously filled in the contact or via hole.

Moreover, a contact resistance and a resistance of the electrical wiring may be reduced since the metal film is formed with at least aluminum.

Furthermore, the productivity of a process for forming metal films may be improved because several processes for forming the metal films may be executed in-situ.

Having described the exemplary embodiments for forming metal films, it is noted that modifications and variations may be made by persons skilled in the art in light of the above teachings. It is therefore understood that changes may be made to the exemplary embodiments of the present invention, while remaining within the scope and the spirit of the present invention recited by the claims.

What is claimed is:

1. A method for forming a metal film, comprising:
   forming a metal barrier layer on a surface of a substrate, on a bottom surface of a recess and on sidewalls of the recess;
   forming a first metal film on the substrate but not in the recess:
   treating the first metal film with nitrogen plasma to form an insulation film including nitrogen;
   forming a second metal film on a portion of the metal barrier layer in the recess; and
   forming a third metal film on the substrate, the recess and the insulation film.

2. The method for forming a metal film of claim 1, wherein the first metal film is formed at a temperature of approximately 120 to 160° C. for about 1 to 10 seconds and under a pressure of approximately 3 to 10 torr.

3. The method for forming a metal film of claim 1, wherein the first metal film is treated with the nitrogen plasma having a plasma power of approximately 50 to 500 watts at a temperature of approximately 120 to 160° C. for about 1 to 60 seconds and under a pressure of approximately 1 to 10 torr.

4. The method for forming a metal film of claim 1, wherein the second metal film is formed at a temperature of approximately 120 to 160° C. for about 30 to 180 seconds and under a pressure of approximately 0.2 to 5.0 torr.

5. The method for forming a metal film of claim 1, wherein the first metal film is formed by a chemical vapor deposition process using a first source gas selected from at least one of dimethylethylaminealane (DEMMA), methylpyroridinealane (MPA), and dimethylaluminumhydride (DMAH), and the second metal film is formed by a chemical vapor deposition process by using a second source gas selected from at least one of DEMMA, MPA, and DMAH.

6. The method for forming a metal film of claim 5, wherein a flow rate of the second gas is approximately eight to twelve times greater than a flow rate of the first source gas.

7. The method for forming a metal film of claim 1, wherein the second metal film has a thickness approximately three to ten times thicker than a thickness of the first metal film.

8. The method for forming a metal film of claim 1, wherein the first metal film, the insulation film, and the liner are formed in-situ.

9. The method for forming a metal film of claim 1, wherein the first, the second, and the third metal films each include an aluminum film.

10. The method for forming a metal film of claim 1, wherein the third metal film is formed by successively performing a sputtering process and a re-flowing process.

11. The method for forming a metal film of claim 1, wherein the metal barrier layer includes one of a titanium film, a titanium nitride film, and multi-layered film having successively formed titanium and titanium nitride films.

12. The method for forming a metal film of claim 1, wherein a step coverage of the second metal film is superior to a step coverage of the first film.

13. A method for forming a metal film, comprising:
   forming a metal barrier layer on a surface of a substrate on a bottom surface of a recess and on sidewalls of the recess;
   forming an insulation film on the surface of the substrate but not in the recess;
   forming a first metal film on a portion of the metal barrier layer positioned in the recess; and
   filling the recess with a second metal film.

14. The method for forming a metal film of claim 13, wherein the insulation film is formed using a nitrogen plasma treatment, the nitrogen plasma treatment is performed having a plasma power of approximately 50 to 500 watts at a temperature of approximately 120 to 160° C. for about 1 to 10 seconds and under a pressure of approximately 3 to 10 torr.

15. The method for forming a metal film of claim 13, wherein the first metal film is formed at a temperature of approximately 120 to 160° C. for about 30 to 180 seconds and under a pressure of approximately 0.2 to 5.0 torr.

16. The method for forming a metal film of claim 13, wherein the insulation film is formed by a chemical vapor deposition process by using a first source gas including at least one of dimethylethylaminealane (DEMMA), methylpyroridinealane (MPA), and dimethylaluminumhydride (DMAH), and the first metal film is formed by a chemical vapor deposition process by using a second source gas including at least one of DEMMA, MPA, and DMAH.

17. The method for forming a metal film of claim 16, wherein a flow rate of the second gas is approximately eight to twelve times greater than a flow rate of the first source gas.

18. The method for forming a metal film of claim 13, wherein the first metal film has a thickness approximately three to ten times thicker than a thickness of the insulation film.

19. The method for forming a metal film of claim 13, wherein the metal barrier film, the insulation film, and the liner are formed in-situ.

20. The method for forming a metal film of claim 13, wherein the second metal film is formed by successively performing a sputtering process and a re-flowing process.

21. The method for forming a metal film of claim 13, wherein a step coverage of the first metal film is superior to a step coverage of the insulation film.

22. A semiconductor device, comprising:
   a metal barrier layer formed in a recess of a substrate;
   an insulation film formed on a portion of the metal barrier layer but not in the recess;
   a metal film formed on a portion of the metal barrier layer in the recess; and
   another metal film formed on the substrate, wherein the insulation film is formed by treating a metal film with nitrogen plasma.

23. A semiconductor device, comprising:
   a metal barrier layer formed in a recess of a substrate;
   an insulation film formed on a portion of the metal barrier layer but not in the recess;
   a metal film formed on a portion of the metal barrier layer in the recess; and
   another metal film formed on the substrate, wherein the another metal film is formed on the substrate, the recess and the insulation film.

24. A method of forming a semiconductor device, comprising:
   forming a metal barrier layer in a recess of a substrate;
   forming an insulation film on a portion of the metal barrier layer but not in the recess;
   forming a metal film on a portion of the metal barrier layer in the recess; and forming another metal film on the substrate, wherein the insulation film is formed by treating a metal film with a nitrogen plasma treatment.

25. A method of forming a semiconductor device, comprising:

forming a metal barrier layer in a recess of a substrate;

forming an insulation film on a portion of the metal barrier layer but not in the recess;

forming a metal film on a portion of the metal barrier layer in the recess; and forming another metal film on the substrate, wherein the another metal film is formed on the substrate, the recess and the insulation film.

* * * * *